United States Patent
Theivanayagam

(10) Patent No.: US 10,947,413 B2
(45) Date of Patent: Mar. 16, 2021

(54) CHEMICAL MECHANICAL POLISHING METHOD FOR COBALT WITH HIGH COBALT REMOVAL RATES AND REDUCED COBALT CORROSION

(71) Applicant: Rohm and Haas Electronic Materials CMP Holdings, Inc., Newark, DE (US)

(72) Inventor: Murali Ganth Theivanayagam, Newark, DE (US)

(73) Assignee: Rohm and Haas Electronic Materials CMP Holdings, Newark, DE (US)

( * ) Notice: Subject to any disclaimer, the term of this patent is extended or adjusted under 35 U.S.C. 154(b) by 0 days.

(21) Appl. No.: 16/369,085

(22) Filed: Mar. 29, 2019

(65) Prior Publication Data

US 2020/0308445 A1    Oct. 1, 2020

(51) Int. Cl.
| | | |
|---|---|---|
| *H01L 21/302* | (2006.01) |
| *C09G 1/02* | (2006.01) |
| *H01L 21/321* | (2006.01) |
| *B24B 37/04* | (2012.01) |

(52) U.S. Cl.
CPC .............. *C09G 1/02* (2013.01); *B24B 37/044* (2013.01); *H01L 21/3212* (2013.01)

(58) Field of Classification Search
None
See application file for complete search history.

(56) References Cited

U.S. PATENT DOCUMENTS

| | | | | |
|---|---|---|---|---|
| 9,576,818 B2 * | 2/2017 | Miller | ................... | C09G 1/02 |
| 9,984,895 B1 * | 5/2018 | Ho | ................... | H01L 21/3212 |
| 10,170,335 B1 * | 1/2019 | Theivanayagam | | H01L 21/3212 |
| 2013/0186850 A1 * | 7/2013 | Wang | ................... | C09K 3/1463 216/13 |
| 2016/0107289 A1 * | 4/2016 | Cavanaugh | ............. | B24B 37/24 216/53 |
| 2016/0108286 A1 | 4/2016 | Sikma et al. | | |
| 2017/0009101 A1 * | 1/2017 | Yasui | ................... | B24B 37/044 |
| 2017/0362464 A1 * | 12/2017 | Reichardt | ................ | C09G 1/02 |
| 2018/0016468 A1 * | 1/2018 | Reichardt | ................ | C09G 1/02 |
| 2019/0085206 A1 * | 3/2019 | Theivanayagam | .. | C09K 3/1454 |

FOREIGN PATENT DOCUMENTS

WO    2017025536    2/2017

* cited by examiner

*Primary Examiner* — Shamim Ahmed
(74) *Attorney, Agent, or Firm* — John J. Piskorski

(57) ABSTRACT

A process for chemical mechanical polishing cobalt to planarize the surface and remove at least some of the cobalt from a substrate. The process includes providing a polishing composition, containing, as initial components: water; an oxidizing agent; colloidal silica abrasive particles; aspartic acid or salts thereof; a phosphonic acid having an alkyl group of greater than ten carbon atoms, wherein the phosphonic acid having the alky group of greater than ten carbon atoms is included in amounts sufficient to enable high cobalt removal rates of ≥2000 Å/min and substantial cobalt corrosion inhibition; and providing a chemical mechanical polishing pad, having a polishing surface; creating dynamic contact at an interface between the polishing pad and the substrate; and dispensing the polishing composition onto the polishing surface at or near the interface between the polishing pad and the substrate; wherein some of the cobalt is polished away and cobalt corrosion is substantially inhibited.

3 Claims, No Drawings

CHEMICAL MECHANICAL POLISHING METHOD FOR COBALT WITH HIGH COBALT REMOVAL RATES AND REDUCED COBALT CORROSION

FIELD OF THE INVENTION

The present invention is directed to a method for chemical mechanical polishing of cobalt with high cobalt removal rates and reduced cobalt corrosion. More specifically, the present invention is directed to a method for chemical mechanical polishing of cobalt with high cobalt removal rates and reduced cobalt corrosion using a chemical mechanical polishing composition containing aspartic acid and phosphonic acids, wherein the phosphonic acids have an alkyl group of greater than ten carbon atoms and the phosphonic acids are at concentrations to enable the high cobalt removal rates and the reduced cobalt corrosion; and providing a chemical mechanical polishing pad, having a polishing surface; creating dynamic contact at an interface between the polishing pad and the substrate; and dispensing the chemical mechanical polishing composition onto the polishing surface at or near the interface between the polishing pad and the substrate where some of the cobalt is polished away from the substrate.

BACKGROUND OF THE INVENTION

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials can be deposited by numerous deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry. However, there is a great deal of complexity involved in CMP. Each type of material requires a unique polishing composition, a properly designed polishing pad, optimized process settings for both polish and post-CMP clean and other factors that must be individually tailored to the application of polishing specific materials.

For advanced technical nodes, 10 nm and below, cobalt is being implemented to replace tungsten plugs connecting transistor gates to metal interconnects in Back End of Line (BEOL) and replace copper in metal lines and vias for the first few metal layers in BEOL. All these new processes require CMP to achieve planarity to the desired targeted thickness and selectivity of materials. However, cobalt is prone to severe corrosion in aqueous solutions and its lower redox potential makes it an easy galvanic corrosion target when in contact with other nobler metals. Commercial cobalt bulk and barrier CMP slurries very often show severe corrosion defects such as pitting, rough surface and missing cobalt line. Cobalt CMP Slurries, therefore, need to contain effective cobalt corrosion inhibitors that can eliminate corrosion defects while still delivering acceptable removal rates of 2000 Å/min or greater.

Therefore, there is a need for a CMP polishing method and composition for cobalt which enables both high cobalt removal rates of 2000 Å/min or greater and substantial cobalt corrosion inhibition.

SUMMARY OF THE INVENTION

The present invention is directed to a method of chemical mechanical polishing cobalt, including:
providing a substrate comprising cobalt;
providing a chemical mechanical polishing composition, comprising, as initial components: water;
an oxidizing agent;
aspartic acid or salts thereof;
colloidal silica abrasive particles; and
a phosphonic acid having an alkyl group of greater than ten carbon atoms, wherein the phosphonic acid is in amounts of less than 0.002 wt % but greater than 0; and
optionally a biocide;
optionally, a pH adjusting agent;
optionally, a surfactant; and
providing a chemical mechanical polishing pad, having a polishing surface;
creating dynamic contact at an interface between the chemical mechanical polishing pad and the substrate; and
dispensing the chemical mechanical polishing composition onto the polishing surface of the chemical mechanical polishing pad at or near the interface between the chemical mechanical polishing pad and the substrate to remove at least some of the cobalt.

The present invention is also directed to a method of chemical mechanical polishing cobalt, including:
providing a substrate comprising cobalt;
providing a chemical mechanical polishing composition, comprising, as initial components: water;
hydrogen peroxide;
0.1 wt % or greater of aspartic acid or salts thereof;
colloidal silica abrasive particles, wherein the colloidal silica abrasive particles have a negative zeta potential; and
a phosphonic acid having an alkyl group of greater than ten carbon atoms, wherein the phosphonic acid is in amounts of 0.0001 wt % to 0.001 wt %;
optionally, a biocide;
optionally, a surfactant;
optionally, a pH adjusting agent; and,
wherein the chemical mechanical polishing composition has a pH of 7 or greater; and
providing a chemical mechanical polishing pad, having a polishing surface;
creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate to remove at least some of the cobalt.

The present invention is further directed to a method of chemical mechanical polishing cobalt, including: water;
0.1 wt % to 2 wt % of hydrogen peroxide;
0.1 wt % to 5 wt % of aspartic acid or salts thereof;
0.01 wt % to 5 wt % of colloidal silica abrasive particles having a negative zeta potential; and
a phosphonic acid having an alkyl group of twelve to twenty carbon atoms, wherein the phosphonic acid is in amounts of 0.00025 wt % to 0.001 wt %;
a biocide;
optionally, a pH adjusting agent;
optionally, a surfactant; and,
wherein the chemical mechanical polishing composition has a pH of 7 to 11; and
providing a chemical mechanical polishing pad, having a polishing surface;
creating dynamic contact at an interface between the chemical mechanical polishing pad and the substrate; and
dispensing the chemical mechanical polishing composition onto the polishing surface of the chemical mechanical polishing pad at or near the interface between the chemical mechanical polishing pad and the substrate to remove at least some of the cobalt.

The present invention is directed to a method of chemical mechanical polishing cobalt, including:
providing a substrate comprising cobalt;
providing a chemical mechanical polishing composition, comprising, as initial components: water;
0.1 wt % to 1 wt % of hydrogen peroxide;
0.1 wt % to 3 wt % of aspartic acid or salts thereof;
0.01 wt % to 3 wt % of colloidal silica abrasive particles having a negative zeta potential; and,
a phosphonic acid selected from the group consisting of undecylphosphonic acid, dodecylphosphonic acid, tetradecylphosphonic acid, hexadecylphosphonic acid and octadecylphosphonic acid, wherein the phosphonic acid is in amounts of 0.0005 wt % to 0.001 wt %;
0.001 wt % to 0.1 wt % of a biocide;
optionally, a surfactant;
optionally, a pH adjusting agent, wherein the pH adjusting agent is KOH; and,
wherein the chemical mechanical polishing composition has a pH of 7.5 to 8.5; and
providing a chemical mechanical polishing pad, having a polishing surface;
creating dynamic contact at an interface between the chemical mechanical polishing pad and the substrate; and
dispensing the chemical mechanical polishing composition onto the polishing surface of the chemical mechanical polishing pad at or near the interface between the chemical mechanical polishing pad and the substrate to remove at least some of the cobalt.

The method of the present invention enables a cobalt removal rate of ≥2000 Å/min and substantially reduced cobalt corrosion.

The method of the present invention also enables a cobalt removal rate of ≥2000 Å/min with a platen speed of 93 revolutions per minute, a carrier speed of 87 revolutions per minute, a chemical mechanical polishing composition flow rate of 200 mL/min, a nominal down force of 13.8 kPa on a 200 mm polishing machine; and, wherein the chemical mechanical polishing pad comprises a polyurethane polishing layer containing polymeric hollow core microparticles and a polyurethane impregnated non-woven subpad.

DETAILED DESCRIPTION OF THE INVENTION

As used throughout this specification the following abbreviations have the following meanings, unless the context indicates otherwise: ° C.=degrees Centigrade; g=grams; L=liters; mL=milliliters; μ=μm=microns; kPa=kilopascal; Å=angstroms; mV=millivolts; DI=deionized; mm=millimeters; cm=centimeter; min=minute; sec=seconds; rpm=revolutions per minute; lbs=pounds; kg=kilograms; Co=cobalt; $H_2O_2$=hydrogen peroxide; KOH=potassium hydroxide; P=phosphorous; wt %=weight percent; PVD=physical vapor deposited; RR=removal rate; SER=static etch rate; PS=polishing slurry of the invention; and CS=comparative slurry.

The term "chemical mechanical polishing" or "CMP" refers to a process where a substrate is polished by means of chemical and mechanical forces alone and is distinguished from electrochemical-mechanical polishing (ECMP) where an electric bias is applied to the substrate. The term "aspartic acid" means the α-amino acid and can include L-aspartic acid, D-aspartic acid, or racemic mixtures thereof. The term "alkyl group", within the scope of the present invention, means an organic functional group having only carbon atoms and hydrogen atoms present in its structure, wherein the general formula of the alkyl group is $C_nH_{2n+1}$, wherein n is an integer. The term "composition" and "slurry" are used interchangeably throughout the specification. The terms "a" and "an" refer to both the singular and the plural. All percentages are by weight, unless otherwise noted. All numerical ranges are inclusive and combinable in any order, except where it is logical that such numerical ranges are constrained to add up to 100%.

The method of polishing cobalt on a substrate of the present invention uses a chemical mechanical polishing composition which includes, as initial components, water; an oxidizing agent; aspartic acid or salts thereof; colloidal silica abrasive particles; and a phosphonic acid having an alkyl group of greater than ten carbon atoms, wherein the phosphonic acid is in amounts of less than 0.002 wt % but greater than 0; optionally, a surfactant; optionally, a biocide; and optionally, a pH adjusting agent for planarizing the cobalt and substrate and removing at least some of the cobalt from the substrate surface at a high removal rate, preferably ≥2000 Å/min, and at the same time inhibiting substantial cobalt corrosion.

Preferably, the method of polishing cobalt of the present invention, includes: providing a substrate, wherein the substrate comprises cobalt; providing a chemical mechanical polishing composition, comprising, (preferably consisting of), as initial components: water; an oxidizing agent, preferably, in amounts of 0.01 wt % to 2 wt %, more preferably in amounts of 0.1 wt % to 1 wt %, even more preferably from 0.1 wt % to 0.5 wt %; aspartic acid or salts thereof or mixtures thereof in amounts equal to or greater than 0.1 wt %, preferably, 0.1 wt % to 5 wt %, more preferably, 0.1 wt % to 3 wt %, even more preferably, from 0.3 wt % to 1 wt %, even still more preferably, from 0.3 wt % to 0.9 wt %; and most preferably, from 0.5 wt % to 0.9 wt %; colloidal silica abrasive particles, preferably, in amounts of 0.01 wt % to 5 wt %, more preferably, from 0.01 wt % to 3 wt %; even more preferably, in amounts of 0.3 wt % to 3 wt %; and a phosphonic acid having an alkyl group of greater than ten carbon atoms, wherein the phosphonic acid is in amounts of less than 0.002 wt % but greater than 0, preferably from 0.0001 wt % to 0.001 wt %, more preferably, from 0.00025 wt % to 0.001 wt %, even more preferably, from 0.0005 wt % to 0.001 wt %, most preferably, from 0.00075 wt % to 0.001 wt %; optionally a biocide; optionally, a surfactant; and, optionally, a pH adjusting agent; wherein the chemical mechanical polishing composition has a pH of 7 or greater; preferably, 7 to 11; more preferably, from 7.5 to 10; even more preferably, from 7.5 to 9; and most preferably from 7.5 to 8.5 (such as 7.5 to 8, or 8 to 8.5); providing a chemical mechanical polishing pad, having a polishing surface; creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate; wherein at least some of the cobalt is polished away from the substrate at a removal rate of, preferably, ≥2000 Å/min and the corrosion of the cobalt is substantially reduced or inhibited, as evidenced by low static etch rates.

Preferably, in the method of polishing cobalt of the present invention, the water contained, as an initial component, in the chemical mechanical polishing composition provided is at least one of deionized and distilled to limit incidental impurities.

Preferably, in the method of polishing cobalt of the present invention, the chemical mechanical polishing composition provided contains, as an initial component, an oxidizing agent, wherein the oxidizing agent is selected from the group consisting of hydrogen peroxide ($H_2O_2$), monopersulfates, iodates, magnesium perphthalate, peracetic acid and other per-acids, persulfate, bromates, perbromate, persulfate, peracetic acid, periodate, nitrates, iron salts, cerium salts, Mn (III), Mn (IV) and Mn (VI) salts, silver salts, copper salts, chromium salts, cobalt salts, halogens, hypochlorites and a mixture thereof. More preferably, the oxidizing agent is selected from the group consisting of hydrogen peroxide, perchlorate, perbromate; periodate, persulfate and peracetic acid. Most preferably, the oxidizing agent is hydrogen peroxide.

Preferably, in the method of polishing cobalt of the present invention, the chemical mechanical polishing composition provided contains, as an initial component, 0.01 wt % to 2 wt %, more preferably, 0.1 wt % to 1 wt %; even more preferably 0.1 wt % to 0.5 wt %; most preferably, 0.2 wt % to 0.4 wt % of an oxidizing agent.

In the method of polishing cobalt of the present invention, the chemical mechanical polishing composition provided contains, as an initial component, aspartic acid, salts of aspartic acid, or mixtures thereof in amounts of at least 0.1 wt %. Salts of aspartic acid include, but are not limited to, L-aspartic acid sodium salt monohydrate, L-aspartic acid potassium salt and DL-aspartic acid potassium salt. Preferably, in the method of polishing cobalt of the present invention, L-aspartic acid is included in the chemical mechanical polishing composition of the present invention. In the method of polishing cobalt of the present invention, the chemical mechanical polishing composition provided contains, as an initial component, preferably, 0.1 wt % to 5 wt %, more preferably, 0.1 wt % to 3 wt %, even more preferably, from 0.3 wt % to 1 wt %, even still more preferably from 0.3 wt % to 0.9 wt %, and most preferably, from 0.5 wt % to 0.9 wt % of L-aspartic acid, D-aspartic acid, racemic mixtures, salts thereof, or mixtures thereof.

In the method of polishing cobalt of the present invention, the chemical mechanical polishing composition provided contains, as an initial component, a phosphonic acid having an alkyl group of greater than ten (10) carbon atoms, wherein the phosphonic acid is in amounts of less than 0.002 wt % but greater than 0. Preferably in the method of polishing cobalt of the present invention the phosphonic acid has a general formula:

(I)

wherein R is a linear or branched alkyl group of greater than ten (10) carbon atoms, preferably, R is a linear or branched alkyl group of twelve (12) to twenty (20) carbon atoms, more preferably, R is a linear alkyl group of twelve (12) to eighteen (18) carbon atoms, further preferably, R is a linear alky group of twelve (12) to sixteen (16) carbon atoms, most preferably, R is a linear alkyl group of twelve (12) or fourteen (14) carbon atoms. Exemplary phosphonic acids of the present invention are unadecylphosphonic acid, dodecylphosphonic acid, tetradecylphosphonic acid, hexadecylphosphonic acid and octadecylphosphonic acid, wherein the most preferred are dodecylphosphonic acid and tetradecylphosphonic acid.

Preferably, in the method of polishing cobalt of the present invention, phosphonic acids or salts thereof having an alkyl group of greater than ten (10) carbon atoms are included in the chemical mechanical polishing compositions in amounts of 0.0001 wt % to 0.001 wt %, more preferably, from 0.00025 wt % to 0.001 wt %, even more preferably, from 0.0005 wt % to 0.001 wt %, most preferably, from 0.00075 wt % to 0.001 wt %.

In the method of polishing cobalt of the present invention, the chemical mechanical polishing composition provided contains colloidal silica abrasive particles. Preferably, in the method of polishing cobalt of the present invention, the chemical mechanical polishing composition provided contains colloidal silica abrasive particles having an average particle diameter of 25 nm or less and a permanent negative zeta potential, wherein the chemical mechanical polishing composition has a pH of 7 or greater; preferably, 7 to 11; more preferably, from 7.5 to 10; even more preferably, from 7.5 to 9; and most preferably from 7.5 to 8.5 (such as 7.5 to 8, or 8 to 8.5). More preferably, in the method of polishing cobalt of the present invention, the chemical mechanical polishing composition provided contains colloidal silica abrasive particles having an average particle diameter of 30 nm or less and a permanent negative zeta potential, wherein the chemical mechanical polishing composition has a pH of 7 or greater; preferably, 7 to 11; more preferably, from 7.5 to 10; even more preferably, from 7.5 to 9; and most preferably from 7.5 to 8.5 (such as 7.5 to 8, or 8 to 8.5); wherein a zeta potential is from −0.1 mV to −35 mV.

In the method of polishing cobalt of the present invention, the chemical mechanical polishing composition provided contains, as an initial component, colloidal silica abrasive particles having an average particle diameter of 30 nm or less, preferably, 5 nm to 30 nm; more preferably, 10 nm to less than 30 nm; even more preferably, from 10 nm to 28 nm, still more preferably, from 15 nm to 25 nm, most preferably, 15 nm to 23 nm, as measured by dynamic light scattering techniques. Suitable particle size measuring instruments are available from, for example, CPS Instruments, Inc. (Prairieville, La., USA) or Malvern Instruments (Malvern, UK).

Preferably, the colloidal silica abrasives are spherical in contrast to cocoon shaped colloidal silica abrasives which are conjoined or combined spheres. Spherical colloidal silica particles are not conjoined spheres. Size of spherical colloidal silica particles is measured by the diameter of the particle. In contrast, the size of cocoon particles, which are conjoined spheres, is the diameter of the smallest sphere that encompasses the particle and the length of the particle. Examples of commercially available spherical colloidal silica particles with negative zeta potentials are Fuso™ PL-2L particles (average particle diameter of 23 nm) available from Fuso Chemical Co., LTD and K1598-B-12 (average particle diameter of 20 nm) available from EMD Performance Materials, Merck KGaA.

Preferably, in the method of polishing cobalt of the present invention, the chemical mechanical polishing composition provided contains, as initial components, preferably, in amounts of 0.01 wt % to 5 wt %, more preferably, from 0.01 wt % to 3 wt %; even more preferably, in amounts of 0.3 wt % to 3 wt % of colloidal silica abrasive particles having a particle diameter of less than or equal to 30 nm, preferably, 5 nm to 30 nm; more preferably, 10 nm to less than 30 nm; even more preferably, from 10 nm to 28 nm, still more preferably, from 15 nm to 25 nm, most preferably, 15 nm to 23 nm, as measured by dynamic light scattering techniques. Preferably, the colloidal silica abrasive particles have a permanent negative zeta potential.

Optionally, the chemical mechanical polishing composition contains a pH adjusting agent. Preferably, the pH adjusting agent is selected from the group consisting of inorganic and organic pH adjusting agents. More preferably, the pH adjusting agent is selected from the group consisting of inorganic acids and inorganic bases. Further preferably, the pH adjusting agent is selected from the group consisting of nitric acid and potassium hydroxide. Most preferably, the pH adjusting agent is potassium hydroxide. Sufficient amounts of the pH adjusting agent are added to the chemical mechanical polishing composition to maintain a desired pH or pH range.

Optionally, in the method of the present invention, the chemical mechanical polishing composition contains biocides, such as KORDEK™ MLX (9.5-9.9% methyl-4-isothiazolin-3-one, 89.1-89.5% water and ≤1.0% related reaction product) or KATHON™ ICP III containing active ingredients of 2-methyl-4-isothiazolin-3-one and 5-chloro-2-methyl-4-isothiazolin-3-one, each manufactured by The Dow Chemical Company, (KATHON and KORDEK are trademarks of The Dow Chemical Company).

In the method of polishing cobalt of the present invention, optionally, the chemical mechanical polishing composition provided can contain, as an initial component, 0.001 wt % to 0.1 wt %, preferably, 0.001 wt % to 0.05 wt %, more preferably, 0.001 wt % to 0.01 wt %, still more preferably, 0.001 wt % to 0.005 wt %, of biocide.

Optionally, in the method of the present invention, the chemical mechanical polishing composition can further include defoaming agents, such as non-ionic surfactants including esters, ethylene oxides, alcohols, ethoxylate, silicon compounds, fluorine compounds, ethers, glycosides and their derivatives. Anionic ether sulfates such as sodium lauryl ether sulfate (SLES) as well as the potassium and ammonium salts. The surfactant can also be an amphoteric surfactant.

In the method of polishing cobalt of the present invention, optionally, the chemical mechanical polishing composition provided can contain, as an initial component, 0.001 wt % to 0.1 wt %, preferably, 0.001 wt % to 0.05 wt %, more preferably, 0.01 wt % to 0.05 wt %, still more preferably, 0.01 wt % to 0.025 wt %, of a surfactant.

Preferably, in the method of polishing cobalt of the present invention, the chemical mechanical polishing pad provided can be any suitable polishing pad known in the art. One of ordinary skill in the art knows to select an appropriate chemical mechanical polishing pad for use in the method of the present invention. More preferably, in the method of polishing cobalt of the present invention, the chemical mechanical polishing pad provided is selected from woven and non-woven polishing pads. Still more preferably, in the method of polishing cobalt of the present invention, the chemical mechanical polishing pad provided comprises a polyurethane polishing layer. Most preferably, in the method of polishing cobalt of the present invention, the chemical mechanical polishing pad provided comprises a polyurethane polishing layer containing polymeric hollow core microparticles and a polyurethane impregnated non-woven subpad. Preferably, the chemical mechanical polishing pad provided has at least one groove on the polishing surface.

Preferably, in the method of polishing cobalt of the present invention, the chemical mechanical polishing composition provided is dispensed onto a polishing surface of the chemical mechanical polishing pad provided at or near an interface between the chemical mechanical polishing pad and the substrate containing cobalt.

Preferably, in the method of polishing cobalt of the present invention, dynamic contact is created at the interface between the chemical mechanical polishing pad provided and the substrate containing cobalt with a down force of 0.69 to 34.5 kPa normal to a surface of the substrate being polished.

In the method of polishing cobalt of the present invention, the chemical mechanical polishing composition provided has a cobalt removal rate of preferably ≥2000 Å/min; more preferably, ≥2200 Å/min; even more preferably, ≥2300 Å/min; still more preferably, ≥2380 Å/min, further preferably, ≥2390 Å/min, most preferably, ≥2400 Å/min; and, with a platen speed of 93 revolutions per minute, a carrier speed of 87 revolutions per minute, a chemical mechanical polishing composition flow rate of 200 mL/min, a nominal down force of 13.8 kPa on a 200 mm polishing machine; and, wherein the chemical mechanical polishing pad comprises a polyurethane polishing layer containing polymeric hollow core microparticles and a polyurethane impregnated non-woven subpad; and wherein corrosion of the cobalt is substantially reduced or inhibited as evidenced by static etch rate (SER).

The following examples are intended to illustrate the high removal rate of cobalt and the inhibition of cobalt corrosion for one or more embodiments of the present invention but are not intended to limit its scope.

Example 1

Slurry Formulations

The following chemical mechanical polishing slurries were prepared in DI water at room temperature. The pH of each slurry was adjusted to 8 with 45 wt % aqueous KOH.

TABLE 1

| Slurry# | Aspartic Acid[1] (wt %) | Phosphonic Acid[1] (wt %) | FUSO™ PL-2L Particles[2] (wt %) | $H_2O_2$ (wt %) | KORDEK™ MLX Biocide (wt %) |
|---|---|---|---|---|---|
| PS-1 | 0.5 | 0.001 Dodecyl | 3 | 0.3 | 0.02 |
| PS-2 | 0.5 | 0.001 Tetradecyl | 3 | 0.3 | 0.02 |
| PS-3 | 0.5 | 0.001 Dodecyl | — | 0.3 | 0.02 |
| PS-4 | 0.5 | 0.001 Tetradecyl | — | 0.3 | 0.02 |

[1]Available from Sigma-Aldrich Corporation.
[2]Available from Fuso Chemical Company LTD, Japan.

Example 2

Comparative Slurry Formulations

The following comparative chemical mechanical polishing slurries were prepared in DI water at room temperature. The pH of each slurry was adjusted to 8 with 45 wt % aqueous KOH.

TABLE 2

| Comparative Slurry# | Aspartic Acid (wt %) | Corrosion Inhibitor (wt %) | FUSO™ PL-2L Particles (wt %) | $H_2O_2$ (wt %) | KORDEK™ MLX Biocide (wt %) |
|---|---|---|---|---|---|
| CS-1 | 0.5 | — | 3 | 0.3 | 0.02 |
| CS-2 | 0.5 | 0.001 Hexylphosphonic Acid | 3 | 0.3 | 0.02 |
| CS-3 | 0.5 | 0.002 Hexylphosphonic Acid | 3 | 0.3 | 0.02 |
| CS-4 | 0.5 | 0.001 Decylphosphonic Acid | 3 | 0.3 | 0.02 |
| CS-5 | 0.5 | 0.002 Decylphosphonic Acid | 3 | 0.3 | 0.02 |
| CS-6 | 0.5 | 0.002 Dodecylphosphonic Acid | 3 | 0.3 | 0.02 |
| CS-7 | 0.5 | 0.002 Tetradecylphosphonic Acid | 3 | 0.3 | 0.02 |
| CS-8 | 0.5 | — | — | 0.3 | 0.02 |
| CS-9 | 0.5 | 0.001 Hexylphosphonic Acid | — | 0.3 | 0.02 |
| CS-10 | 0.5 | 0.002 Hexylphosphonic Acid | — | 0.3 | 0.02 |
| CS-11 | 0.5 | 0.001 Decylphosphonic Acid | — | 0.3 | 0.02 |
| CS-12 | 0.5 | 0.002 Decylphosphonic Acid | — | 0.3 | 0.02 |
| CS-13 | 0.5 | 0.002 Dodecylphosphonic Acid | — | 0.3 | 0.02 |
| CS-14 | 0.5 | 0.002 Tetradecylphosphonic Acid | — | 0.3 | 0.02 |

Example 3

Chemical Mechanical Polishing of Cobalt and SER of Cobalt

The procedures and apparatus used to polish cobalt and determine the static etch rate (SER) for the slurries in Tables 1-2 are described immediately below.

TABLE 3

| CMP Polishing and Cleaning Conditions | |
|---|---|
| Polishing Tool | AMAT- MIRRA |
| Pad | VISIONPAD™ 6000 PAD--a polyurethane; Shore D hardness of 57, 30 and 60 µm average diameter closed cell pores and circular grooves having a depth, width and pitch of 760, 510 and 3,050 µm, respectively |
| Conditioner | Saesol 8031C1-170 µm diamond size; 40 µm diamond protrusion and 310 µm diamond spacing |
| Process | 2 PSI (13.8 kPa), 93/87 RPM, 200 ml/min (Downforce, Platen Speed/Carrier Speed, Slurry Flow Rate) |

TABLE 3-continued

| CMP Polishing and Cleaning Conditions | |
|---|---|
| Polishing Tool | AMAT- MIRRA |
| Post CMP clean | Synergy - ATMI PlanarClean ™ Composition: Ethanolamine (1 to 10 wt %), Tetramethylammonium hydroxide (1 to 10 wt %), pH >13.5 and dilution 1:20. |
| Polish Time | Co Wafer: 20 sec |
| Wafers | 200 mm PVD cobalt wafer obtained from Novati (~1700 Å thick) |

The polished wafers were passed through a DSS-200 Synergy™ (OnTrak) double-sided wafer scrubber running ATMI PlanarClean chemistry, cobalt removal rates were measured with RS200 metal film thickness measurement tool by KLA Tencor. Cobalt RR results are in Table 4.

Static-Etch (Corrosion) Analyses

Blanket Co wafers from Novati Technologies (200 mm, ~1700 Å thick PVD Co deposited on to silicon substrate) were used as received. Gamry PTC1™ paint test cells were used for analysis, the whole 200 mm Co wafer was clamped between a glass tube with an O-ring seal and a custom-made TEFLON™ base. 3M-470, electroplaters tape with 3.0 cm² of open area was used in-between the wafer and the O-ring to avoid any crevice or stress type local corrosion. For high temperature analysis, 30 mL of static-etch slurry was kept in an oven at 55° C. to simulate higher local temperatures at pad asperity/wafer contact during polishing, and pre-heated for 60 min and then the slurry was immediately added to the static-etch cell and kept in contact with the wafer for 3 min. After the desired hold time, the static-etch solution was collected and analyzed for Co ions by Inductively Coupled Plasma-Optical Emission Spectrometer (ICP-OES) analysis after centrifuging and separating the colloidal silica abrasives when present in the formulation. Colloidal silica abrasives were excluded from some formulations in static-etch experiments for ease of ICP-OES analysis. At least two data points were collected for all the slurries tested to check for reproducibility.

Cobalt static-etch rates (SER) were calculated from cobalt concentration in ICP analysis using the following formula:

$$\text{Cobalt SER (Å/min)} = \{[C \text{ (g/l)} * V \text{ (l)}]/[A \text{ (cm}^2) * D \text{ (g/cm}^3) * T \text{ (min)}]\} * 10^8$$

C=Co concentration from ICP analysis (g/l)
V=Volume of test solution used added in static etch setup (l)
A=Area of cobalt metal exposed to the test solution (cm²)
D=Density of cobalt (8.9 g/cm³)
T=Time of exposure (min)
$10^8$=cm to Å unit conversion

TABLE 4

| Cobalt RR | |
|---|---|
| Slurry# | Å/min |
| PS-1 | 2440 |
| PS-2 | 2387 |
| CS-1 | 2287 |
| CS-2 | 2417 |
| CS-3 | 2396 |

TABLE 4-continued

| Cobalt RR | |
|---|---|
| Slurry# | Å/min |
| CS-4 | 2432 |
| CS-5 | 2303 |
| CS-6 | 239 |
| CS-7 | 660 |

TABLE 5

| Cobalt SER | |
|---|---|
| Slurry# | Å/min |
| PS-1 | 8.5 |
| PS-2 | 6.6 |
| PS-3 | 5.0 |
| PS-4 | 4.1 |
| CS-1 | 14.7 |
| CS-2 | 14.7 |
| CS-3 | 12.9 |
| CS-4 | 14.5 |
| CS-5 | 13.0 |
| CS-8 | 10.2 |
| CS-9 | 10.3 |
| CS-10 | 11.0 |
| CS-11 | 9.1 |
| CS-12 | 9.7 |
| CS-13 | <1.5 |
| CS-14 | <1.5 |

With exception of CS-6 and CS-7, where the slurry formulation included 0.002 wt % dodecylphosphonic acid and 0.002 wt % tetradecylphosphonic acid, respectively, the slurry formulations in Table 4 had Co RR>2000 Å/min. However, as shown in Table 5 the Co SER of PS-3 (0.001 wt % dodecylphosphonic acid) and PS-4 (0.001 wt % tetradecylphosphonic acid) had SER of only 8.5 and 6.6, respectively. In contrast, the comparative slurries CS-8 to CS-12 had Co SER from a high of 14.7 to a low of 12.9. The corrosion inhibition of Co of PS-3 and PS-4 was superior to that of the comparative slurries CS-8 and CS-12. Although CS-13 (0.002 wt % dodecylphosphonic acid) and CS-14 (0.002 wt % tetradecylphosphonic acid) had Co SER of <1.5, slurries including 0.002 wt % dodecylphosphonic acid and 0.002 wt % tetradecylphosphonic acid showed inferior Co RR of only 239 Å/min and 660 Å/min, respectively. Only the slurries which included 0.001 wt % dodecylphosphonic acid or 0.001 wt % tetradecylphosphonic acid had Co RR>2000 Å/min and at the same time had superior Co corrosion inhibition.

Example 4

Comparative Phosphonic Acid Slurry Compositions

The following comparative phosphonic acid chemical mechanical polishing slurries were prepared in DI water at room temperature. The pH of each slurry was adjusted to 8 with 45 wt % aqueous KOH.

TABLE 6

| Comparative Slurry# | Aspartic Acid (wt %) | Phosphonic Acid (wt %) | FUSO ™ PL-2L Particles (wt %) | $H_2O_2$ (wt %) | KORDEK ™ MLX Biocide (wt %) |
|---|---|---|---|---|---|
| CS-15 | 0.5 | 0.1 Phenylphosphonic Acid | 3 | 0.3 | 0.002 |
| CS-16 | 0.5 | 0.1 Ethylphosphonic Acid | 3 | 0.3 | 0.002 |
| CS-17 | 0.5 | 0.1 Butylphosphonic Acid | 3 | 0.3 | 0.002 |
| CS-18 | 0.5 | 0.01 Hexylphosphonic Acid | — | 0.3 | 0.002 |
| CS-19 | 0.5 | 0.01 Hexylphosphonic Acid | 3 | 0.3 | 0.002 |
| CS-20 | 0.5 | 0.1 Hexylphosphonic Acid | 3 | 0.3 | 0.002 |
| CS-21 | 0.5 | 0.01 Decylphosphonic Acid | — | 0.3 | 0.002 |
| CS-22 | 0.5 | 0.01 Decylphosphonic Acid | 3 | 0.3 | 0.002 |
| CS-23 | 0.5 | 0.1 Decylphosphonic Acid | 3 | 0.3 | 0.002 |
| CS-24 | 0.5 | 0.01 Dodecylphosphonic Acid | — | 0.3 | 0.02 |
| CS-25 | 0.5 | 0.01 Dodecylphosphonic Acid | 3 | 0.3 | 0.02 |
| CS-26 | 0.5 | 0.01 Tetradecylphosphonic Acid | — | 0.3 | 0.02 |
| CS-27 | 0.5 | 0.01 Tetradecylphosphonic Acid | 3 | 0.3 | 0.02 |
| CS-28 | 0.5 | 0.01 Nitrilotri(methylphosphonic acid) | — | 0.3 | 0.002 |
| CS-29 | 0.5 | 0.1 Nitrilotri(methylphosphonic acid) | 3 | 0.3 | 0.002 |
| CS-30 | 0.5 | 0.01 Diethylenetriaminepentakis (methylphosphonic acid) | — | 0.3 | 0.002 |
| CS-31 | 0.5 | 0.1 Diethylenetriaminepentakis (methylphosphonic acid) | 3 | 0.3 | 0.002 |

Example 5

Chemical Mechanical Polishing Cobalt with Chemical Mechanical Polishing Slurries Containing Phosphonic Acids and Cobalt Corrosion Inhibition Chemical mechanical polishing cobalt was done according to the procedure and using the materials, apparatus and conditions as described in Table 3 of Example 3 above. The cobalt polishing results are disclosed in Table 7 below.

TABLE 7

| Slurry # | Cobalt RR Å/min |
|---|---|
| PS-1 | 2440 |
| PS-2 | 2387 |
| CS-19 | 2345 |
| CS-22 | 117 |
| CS-25 | 55 |
| CS-27 | 45 |

TABLE 8

| Slurry# | Cobalt SER Å/min |
|---|---|
| PS-1 | 8.5 |
| PS-2 | 6.6 |
| PS-3 | 5.0 |
| PS-4 | 4.1 |
| CS-15 | 15.4 |
| CS-16 | 21.4 |
| CS-17 | 14.5 |
| CS-18 | 11.2 |
| CS-20 | 14.2 |
| CS-21 | 3.7 |
| CS-23 | 2.5 |
| CS-24 | <1.5 |
| CS-26 | <1.5 |
| CS-28 | 15.9 |
| CS-29 | 36.5 |
| CS-30 | 15.4 |
| CS-31 | 47.0 |

Although comparative slurry CS-19 had Co RR>2000 Å/min as PS-1 (0.001 wt % dodecylphosphonic acid) and PS-2 (0.001 wt % tetradecylphosphonic acid), comparative slurries CS-22, CS-25 and CS-27 had Co RR values substantially lower than PS-3 (0.001 wt % dodecylphosphonic acid) and PS-4 (0.001 wt % tetradecylphosphonic acid).

Although comparative slurries CS-21, CS-23, CS-24 and CS-26 had lower Co SER values than PS-1 to PS-4, the remainder of the comparative slurries in Table 8 had Co SER values significantly higher than PS-1 to PS-4. The chemical mechanical polishing slurries of the present invention overall had both Co RR>2000 Å/min and significant cobalt corrosion inhibition in contrast to the comparative slurries.

Example 6

Comparative Fatty Acid Slurry Compositions

The following comparative fatty acid chemical mechanical polishing slurries were prepared in DI water at room temperature. The pH of each slurry was adjusted to 8 with 45 wt % aqueous KOH.

TABLE 9

| Comparative Sample# | Aspartic Acid (wt %) | Fatty Acid (wt %) | $H_2O_2$ (wt %) | KORDEK™ MLX Biocide (wt %) |
|---|---|---|---|---|
| CS-32 | 0.5 | 0.001 Hexanoic Acid | 0.3 | 0.002 |
| CS-33 | 0.5 | 0.002 Hexanoic Acid | 0.3 | 0.002 |
| CS-34 | 0.5 | 0.01 Hexanoic Acid | 0.3 | 0.002 |
| CS-35 | 0.5 | 0.001 Decanoic Acid | 0.3 | 0.002 |
| CS-36 | 0.5 | 0.002 Decanoic Acid | 0.3 | 0.002 |
| CS-37 | 0.5 | 0.01 Decanoic Acid | 0.3 | 0.002 |
| CS-38 | 0.5 | 0.001 Dodecanoic Acid | 0.3 | 0.002 |
| CS-39 | 0.5 | 0.002 Dodecanoic Acid | 0.3 | 0.002 |
| CS-40 | 0.5 | 0.01 Dodecanoic Acid | 0.3 | 0.002 |

Example 7

Cobalt SER

Co SER was determined according to the procedure and parameters as disclosed in Example 3 above. The results are disclosed in Table 10 below.

TABLE 10

| Slurry # | Å/min |
|---|---|
| PS-3 | 5.0 |
| PS-4 | 4.1 |
| CS-32 | 10.2 |
| CS-33 | 9.7 |
| CS-34 | 10 |
| CS-35 | 10.7 |
| CS-36 | 10.3 |
| CS-37 | 11.2 |
| CS-38 | 9.1 |
| CS-39 | 10.2 |
| CS-40 | 10.4 |
| CS-32 | 7.0 |

PS-3 and PS-4 showed significant cobalt corrosion inhibition in contrast to the comparative slurry compositions.

What is claimed is:
1. A method of chemical mechanical polishing cobalt, comprising:
   providing a substrate comprising cobalt;
   providing a chemical mechanical polishing composition, consisting of, as initial components:
   water;
   an oxidizing agent;
   0.3 wt % to 1 wt % aspartic acid or salts thereof;
   colloidal silica abrasive particles; and
   a phosphonic acid or salt thereof having a formula:

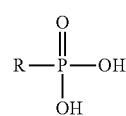

(I)

wherein R is a linear alkyl group of twelve to eighteen carbon atoms, and wherein the phosphonic acid or salt thereof is in amounts of 0.0001 wt % to 0.001 wt %; and
optionally a biocide;
optionally, a pH adjusting agent selected from the group consisting of potassium hydroxide and nitric acid;
optionally, a surfactant; and
wherein a pH of the chemical mechanical polishing composition is from 7-11;
providing a chemical mechanical polishing pad, having a polishing surface;
creating dynamic contact at an interface between the chemical mechanical polishing pad and the substrate; and
dispensing the chemical mechanical polishing composition onto the polishing surface of the chemical mechanical polishing pad at or near the interface between the chemical mechanical polishing pad and the substrate to remove at least some of the cobalt.

2. The method of claim 1, wherein the chemical mechanical polishing composition provided has a cobalt removal rate of ≥2000 Å/min with a platen speed of 93 revolutions per minute, a carrier speed of 87 revolutions per minute, a chemical mechanical polishing composition flow rate of 200 mL/min, a nominal down force of 13.8 kPa on a 200 mm polishing machine; and, wherein the chemical mechanical polishing pad comprises a polyurethane polishing layer containing polymeric hollow core microparticles and a polyurethane impregnated non-woven subpad.

3. The method of claim 1, wherein the phosphonic acid of the chemical mechanical polishing composition provided is selected from the group consisting of dodecylphosphonic acid, tetradecylphosphonic acid and salts thereof.

* * * * *